United States Patent [19]
Donohoe

[11] Patent Number: 5,449,433
[45] Date of Patent: Sep. 12, 1995

[54] USE OF A HIGH DENSITY PLASMA SOURCE HAVING AN ELECTROSTATIC SHIELD FOR ANISOTROPIC POLYSILICON ETCHING OVER TOPOGRAPHY

[75] Inventor: Kevin G. Donohoe, Boise, Id.

[73] Assignee: Micron Semiconductor, Inc., Boise, Id.

[21] Appl. No.: 196,056

[22] Filed: Feb. 14, 1994

[51] Int. Cl.⁶ .............................................. H01L 21/00
[52] U.S. Cl. .................................. 156/643.1; 156/345; 156/646.1; 156/657.1; 156/662.1
[58] Field of Search .............. 156/643, 646, 657, 662, 156/345; 437/228, 195; 118/723 IR; 204/192.37, 298.37

[56] References Cited

U.S. PATENT DOCUMENTS

| | | | |
|---|---|---|---|
| 4,426,246 | 1/1984 | Kravitz et al. | 156/643 |
| 4,918,031 | 4/1990 | Flamm et al. | 156/643 X |
| 4,990,229 | 2/1991 | Campbell et al. | 156/345 X |
| 5,234,529 | 8/1993 | Johnson | 156/345 |
| 5,277,751 | 1/1994 | Ogle | 156/643 |
| 5,336,365 | 8/1994 | Goda et al. | 156/643 |

*Primary Examiner*—Thi Dang
*Attorney, Agent, or Firm*—Lia M. Pappas

[57] ABSTRACT

A method for etching structures having topography, which structures are comprised of polysilicon disposed over an oxide, by placing an electrostatic shield on a high density source etcher while etching the structures. The etch involves the removal of the polysilicon which overhangs the oxide structure below it, thereby substantially eliminating conductive stringers.

18 Claims, 4 Drawing Sheets

USE OF A HIGH DENSITY PLASMA SOURCE HAVING AN ELECTROSTATIC SHIELD FOR ANISOTROPIC POLYSILICON ETCHING OVER TOPOGRAPHY

FIELD OF THE INVENTION

This invention relates to semiconductor manufacturing, and more particularly to an apparatus and method for improving anisotropic etching of silicon.

BACKGROUND OF THE INVENTION

In the manufacture of integrated circuits, deposition of films or materials with non-conformal properties over retrograde topography often yields subsequent structures which also have retrograde or re-entrant profiles. Subsequent depositions of non-conformal and other films over re-entrant profiles frequently result in structures having an "overhang" which obscures the underlying topography.

Retrograde profiles may result from the deposition of: non-conformal films over ideally vertical profiles, and conformal films over profiles which are already retrograde.

Some manufacturing applications involve depositing a material over features which may have retrograde or re-entrant profiles, and then patterning and etching the material. One example is the anisotropic etching of polysilicon over oxide.

Anisotropic etches (i.e., etches exhibiting no significant undercut) are used to prevent significant critical dimension loss. "Critical dimension" refers to the distance between features.

Anisotropic etches remove material in a direction substantially perpendicular to the plane defined by the substrate. The material which is etched must therefore be in the "line of sight" of the plasma, as viewed from a point directly "above" the feature. Consequently, any overhanging topography shelters the material which is anisotropically etched. If conductive materials, such as polysilicon, form the layers, then conductive shorts may result between adjacent features as a consequence of the residual sheltered material. The residual material is referred to as a "stringer," as seen in FIG. 1.

"Stringers" can be defined as residual material resulting from an etch process. The "stringers" are a problem when they are comprised of a conductive material which causes short circuiting between adjacent structures.

Current stacked capacitor dynamic random access memories (DRAMS) often comprise components which have high, vertical (retrograde) topologies. Such topologies are susceptible to "stringers" following etch steps. Since DRAMs are comprised of polysilicon, which is a conductive material, any "stringers" may result in non-functional parts and consequent yield loss.

Furthermore, the etching of sub-half micron structures from polysilicon requires a process having a high degree of selectivity and anisotropy, without damaging the structure being formed.

SUMMARY OF THE INVENTION

The present invention involves placing an electrostatic shield on a high density source etcher while etching polysilicon "stringer" structures. The etch involves the removal of the polysilicon which overhangs the oxide structure below it.

One advantage of the present invention is that the use of an electrostatic shield substantially prevents capacitive coupling between the RF (radio frequency) powered antennae and the plasma. The problem with capacitive coupling is that ions from the plasma impact and remove material from the bell jar surface, which material falls onto the wafer which is being etched. The sputter removal of the material comprising the inner surface of the source bell jar, and its subsequent deposition onto the wafer surface is substantially eliminated by the process of the present invention. The result is the ability to etch stringer structures in a low pressure, high density source.

Another advantage of the present invention is that the etch process is successful when chlorine alone is used as an etchant. Hence, the need to add oxygen or hydrogen bromide (HBr) to the etch chemicals to control the profile of the etched structure is essentially eliminated.

A further advantage of the present invention is that small additions of fluorine containing species (such as, for example, $NF_3$ and $CF_4$) can be used as additives to a chlorine-containing etchant without causing deposition of material from the bell jar onto the wafer surface.

A still further advantage of the present invention is that there is more process control, thereby enabling a more repeatable process, and a larger process window.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
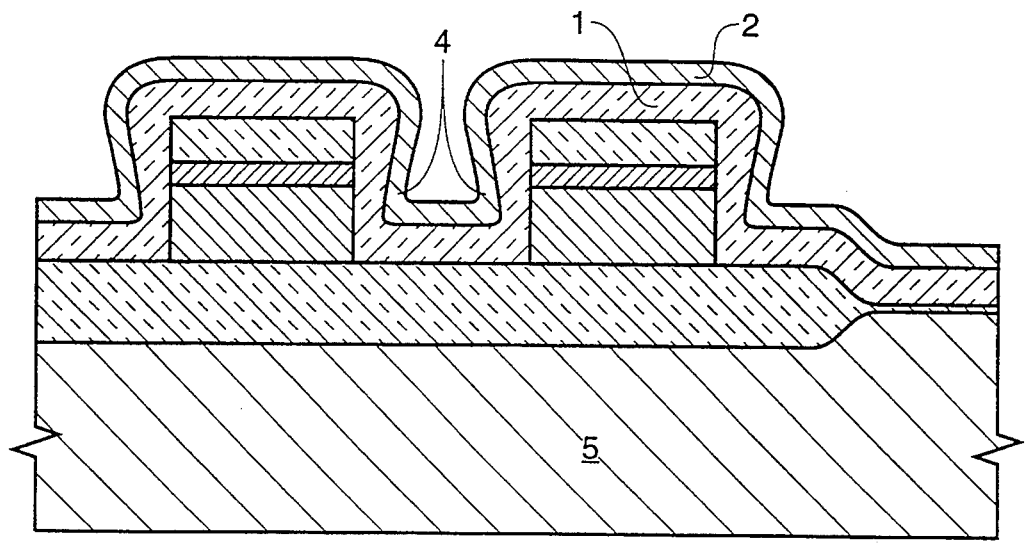
FIG. 1 is a schematic cross-section of the problem of conductive "stringers" in the prior art method.

The present invention is described and illustrated with respect to a submicron capacitor structure. However, one having ordinary skill in the art, upon being apprised of the present invention will appreciate its applicability to the formation of gate structures, as well as other processes, especially those processes which involve etching a polysilicon layer 2 disposed over a layer of oxide 1 or other dielectric. See, for example, FIGS. 1 and 7. The process is particularly useful for etching polysilicon 2 on stacks or other topographies without requiring modification of the shape of the underlying oxide layer 1 (e.g., by forming faceted corners).

Figure 2:
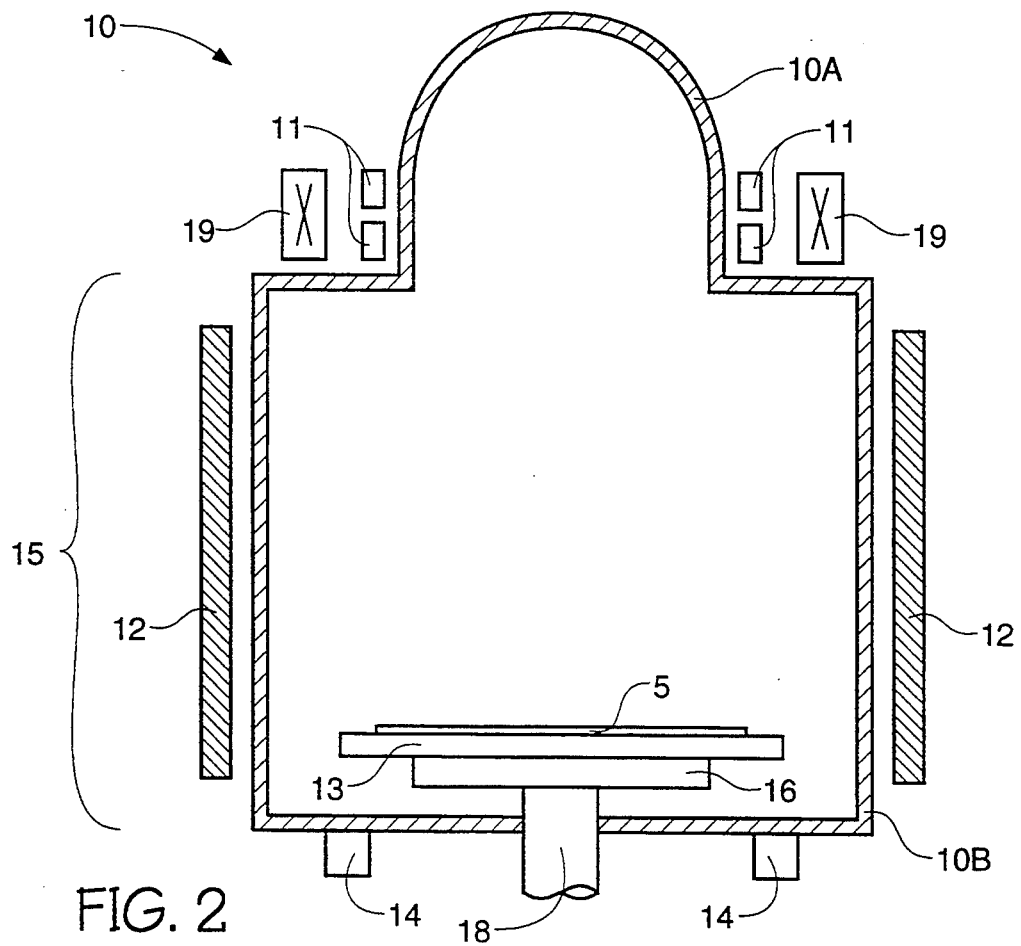
FIG. 2 is a schematic cross-section of a standard configuration of a high density source etcher which causes the stringers of FIG. 1.

Referring to FIG. 2, a design of the standard Mori source reactor 10 is shown. The problem with the standard configuration is that the two antennae 11 loops are at a high enough voltage to couple energy to the plasma capacitively, as well as inductively. This capacitative coupling causes ion sputtering of the material comprising the inner surface of the bell jar 10A onto the wafer 5. The bell jar 10A is typically comprised of alumina or quartz or a similar dielectric which is removed relatively easily by the ion bombardment.

When etching polysilicon with Cl2, the sputtered material deposits on vertical features 4 of the wafer 5 and protects them from being etched. The result is that the stringers 4 are not removed from the structure and the etch is a failure. See, for example, FIG. 1.

A schematic diagram of a high density plasma etching system is shown in FIG. 2. A wafer 5 is cooled by helium gas using a backside cooling apparatus 16. The RF power 18 is applied to at the wafer holder 13. The high density plasma is generated by applying power to the antennae 11, and by using a separate electromagnet 19 to control electron motion inside the source 10A.

The bell jar or source plasma 10A generates ions and neutrals which etch the film. The RF bias power 18 located on the wafer chuck 13 is used to accelerate the ions as the ions drift down from the plasma source 10A into the vicinity of the wafer 5.

The remote source equipment which is currently marketed and used, typically possesses magnetic confinement in the "bucket" or transition zone 15. The confinement uses permanent magnets 12 to prevent electron and ion loss to the chamber walls 10B. In the preferred embodiment of the present invention, the permanent magnets 12 are not used.

In addition, extra magnets 14, which can be permanent or electro-magnetic, may be used to shape the magnetic field near the wafer 5 to help control plasma density and ion trajectory.

In order to obtain the desired etch profile and maintain the desired selectivities: 1) the correct amount of ions and reactive neutrals must be generated in the source plasma and impinge on the wafer surface 5; 2) the ions and reactive neutrals must be allowed to uniformly radially diffuse enough in the "bucket" 15 to produce uniform results on the wafer 5. As the ions and neutrals diffuse, their concentration tends to decrease and their uniformity tends to improve; and 3) the RF bias on the wafer chuck 13 can be used to control the energy of the ions that hit the wafer 5.

The greater the RF bias, the greater the energy imparted to the ions, and the greater the oxide etch rate. High bias results in decreased selectivity to oxide 1.

During operation of the standard reactor, there is a voltage drop across the dark space between the plasma and antennae 11. This voltage drop is located between the plasma and the inner glass wall of the bell jar 10A. During operation, capacitive coupling across the dark space increases the voltage across the dark space, and causes ions from the plasma to impact the walls of the bell jar 10A, and sputter material therefrom.

Figure 3:
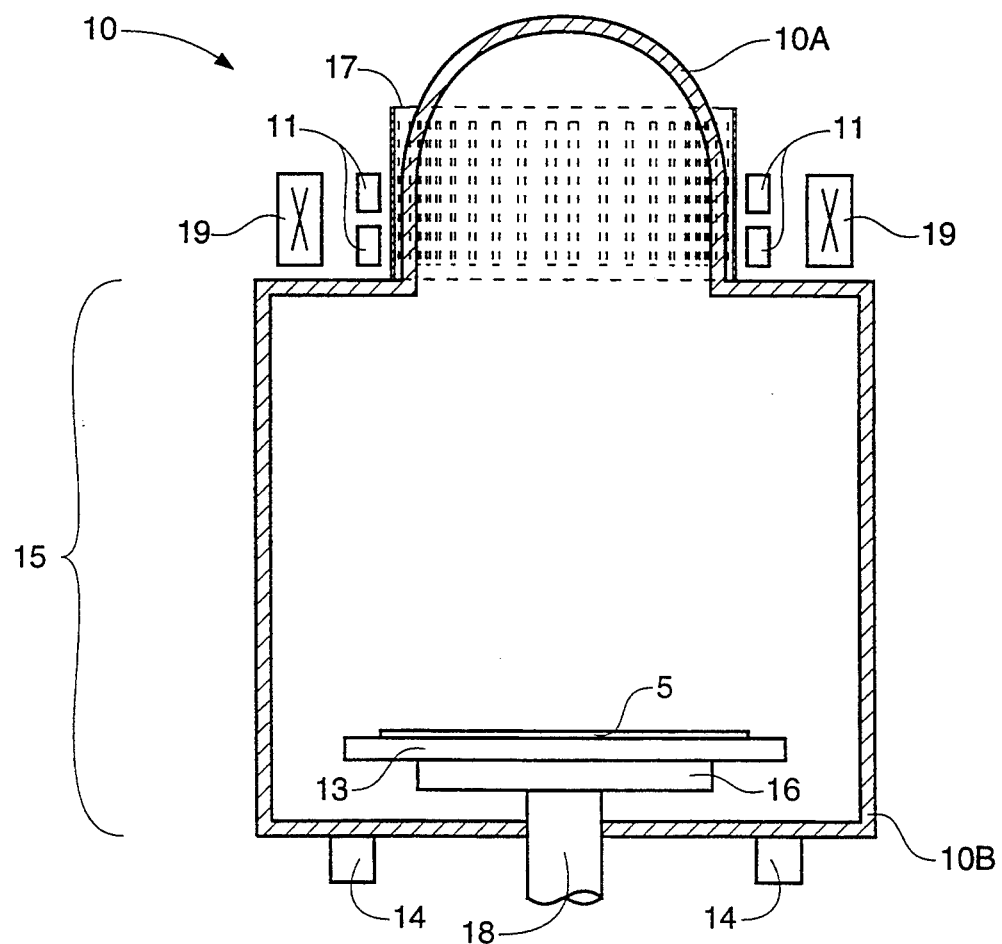
FIG. 3 is a schematic cross-section of the present invention, in which an electrostatic shield is provided around the bell jar of FIG. 2, thereby changing the conditions of the etch process according to the process of the present invention.

FIG. 3 illustrates the reactor of the present invention having the electrostatic shield 17 in place, the deposition of material onto the wafer surface 5 is practically eliminated.

The conditions of the present invention permit the etch to proceed with minimal stringer 4 formation. In the PMT (Plasma and Materials Technology) remote source etcher, such as, for example a "Mori Source Etcher," the conditions are to operate at a pressure substantially in the range of 1–3 mtorr.

The electrostatic shield 17 significantly decreases the capacitive coupling between the antennae 11 in the Mori source reactor (or the coils in another type of inductively coupled source) and the plasma. The capacitive coupling is decreased because the shield 17 protects or blocks the plasma from the antennae's electric field. The electric field is responsible for the capacitive coupling.

When the capacitive coupling is reduced by the use of the electrostatic shield 17 of the present invention, the potential drop across the dark space is reduced. The reduction in the potential drop across the dark space results in a reduction in the energy of the ions that cross the dark space from the plasma, and strike the inner surface of the bell jar 10A.

It is well known that the etch and sputter rates of dielectric materials are highly sensitive to ion energy. Hence, a decrease in ion energy substantially decreases the ion driven removal rates of dielectric materials. Since, the bell jar 10A is fabricated from a dielectric material, a decrease in ion energy results in less removal of the inner surface of the bell jar 10A and its consequent deposition onto the surface of the wafer 5.

Figure 4:
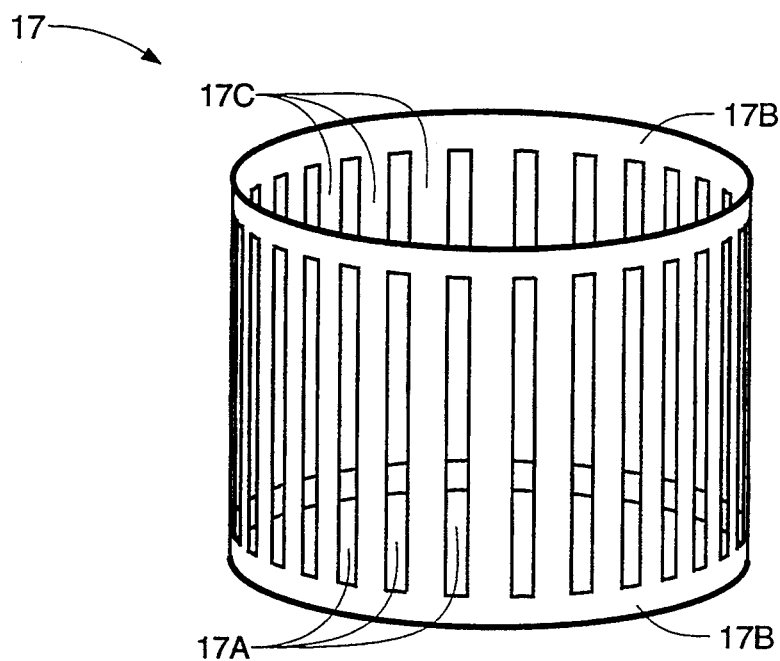
FIG. 4 is a schematic drawing of one embodiment of the electrostatic shield which is used in the process of the present invention which comprises vertical slits.

FIG. 4 is a schematic drawing of the electrostatic shield 17 used in the present invention. This embodiment has slits 17A which run in a vertical direction (i.e., along the length of the bell jar 10A). The slits 17A terminate prior to the edges of the shield 17, and have common rims, or backbones 17B on either side.

The shield in the preferred embodiment is cylindrical in shape and fits over the bell jar 10A portion of the reactor 10. However, it is possible to use a shield 17 having a hemispherical shape (not shown), or alternatively, having a combination cylindrical/hemispherical shape (not shown). The shield 17 is disposed between the bell jar 10A and the antennae 11, where it functions to substantially prevent capacitive coupling between the antennae 11 and the plasma.

Bands or strips of metal 17C are located between the slits 17A. The bands 17C have a width which is preferably larger than the width of the intervening slits 17A. The width of the bands or strips 17C will vary, depending upon the reactor parameters chosen. However, generally the width in the relative range of 1 cm is used for the metal bands 17C. The width of the intervening slits 17A tends to be a little smaller, and is generally in the range of 0.2 cm to 0.5 cm.

The electrostatic shield 17 is comprised of a conductive material, preferably copper. Copper is preferred due to its cost and availability, and the ease with which it can be cut.

Figure 5:
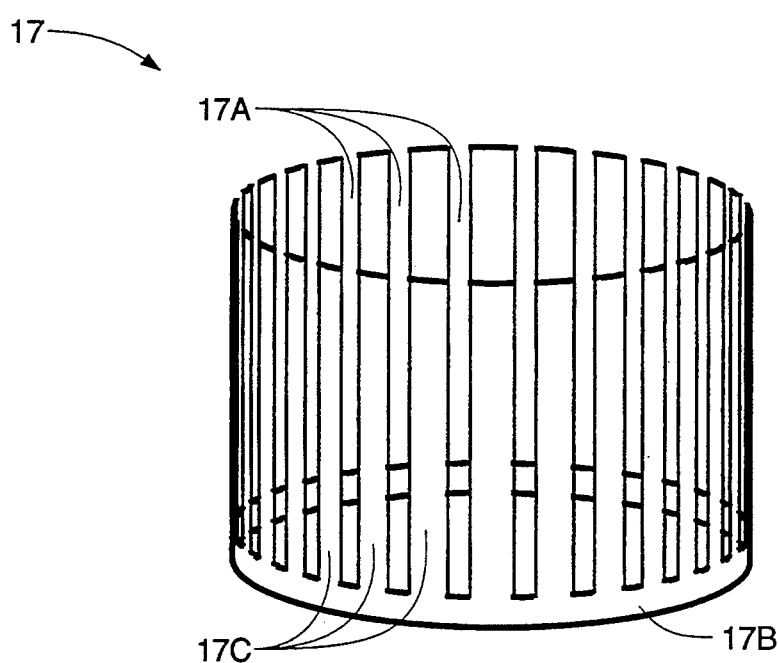
FIG. 5 is a schematic drawing of a second embodiment of the electrostatic shield of the present invention in which the slits of FIG. 4 are opened at one end.

FIG. 5 is a schematic drawing of an alternative embodiment of the shield 17 of the present invention. In this embodiment, the shield 17 is open on one end, thereby resembling a comb.

Figure 6:
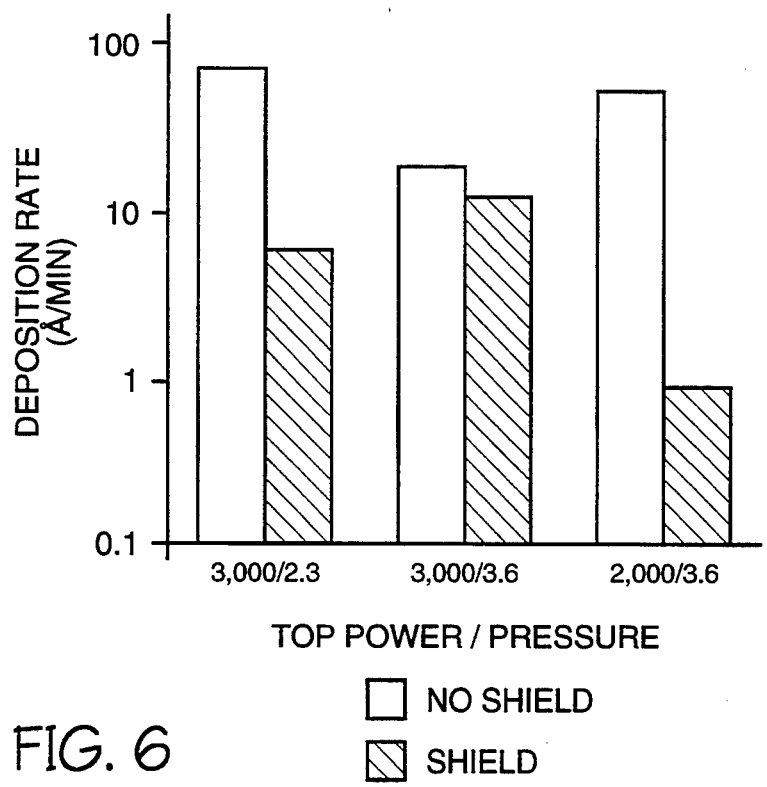
FIG. 6 is a graph of the Effect of Electrostatic Shield on Deposition of Material onto Si Wafer, measured by the Deposition Rate of the Bell Jar Material versus the Conditions of (Top Power/Pressure) for a reactive ion sputter etch.

FIG. 6 illustrates the difference between the material deposited on unbiased silicon wafers with the Standard Configuration versus the Shielded Configuration of the bell jar. The graph data was generated on a reactor 10 using no bottom power, i.e., the bottom power equals zero, so it mimics that area of the wafer 5 which has no undercut (where there is no ionic activity). Hence, the bar graph is, in a sense, a measurement of the deposition activity in that area of the wafer topography 5 where stringers 4 form.

In the Standard Configuration, when chlorine alone is used in the plasma, material is sputtered from the bell jar 10A. However, when fluorine is added to the plasma, there is a greatly increased rate of removal of material from the bell jar 10A which is subsequently deposited on the wafer 5.

However, with the Shielded Configuration of the present invention, it is evident that a decrease in ion energy results in a dramatic decrease in removal of the material comprising the bell jar 10A. The decrease is especially evident for gas chemistries which comprise fluorine-containing compounds.

Figure 7:
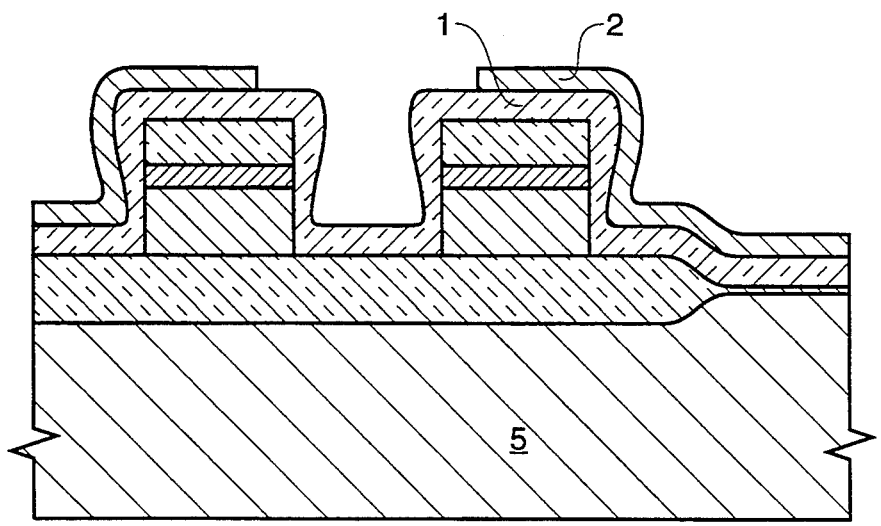
FIG. 7 is a schematic cross-section of the semiconductor substrate of FIG. 1, after the conductive layer has been patterned and etched, and the photoresist pattern has been removed, according to the process of the present invention.

FIG. 7 is a schematic cross-section of the semiconductor feature made with the process of the present invention. A short isotropic etch step was performed at the end of the etch process. In this step, the addition of $NF_3$ or $SF_6$ to a chlorine plasma, generates a small controllable amount of undercut, thereby etching the stringers 4 isotropically.

If the fluorine chemistries had been used without the electrostatic shield of the present invention, the polysilicon layer 2 would have been covered with a deposit, and the stringers 4 would not be removed, but rather the deposit would act to prevent such removal.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art will realize that the present invention not only useful in etching polysilicon layers over oxide, but also for etching polycides (such as tungsten silicide over polysilicon) over an oxide, and nitrides over polysilicon over oxide (such as a poly-buffered LOCOS stack), and any other stack upon polysilicon which stops on an oxide layer, especially when there is topography that has the potential for stringer formation during etching.

I claim:

1. A method for etching a stack comprising polysilicon disposed over oxide while minimizing residual deposits during etch, said method comprising the following steps of:
    disposing a wafer in a high density reactor, said wafer having a topography comprising a layer of polysilicon disposed over a layer of oxide, said topography having a re-entrant profile, said reactor having an electrostatic shield; and
    creating a plasma in said reactor, thereby etching said polysilicon layer obscured by said re-entrant profile, said etching comprises an anisotropic etch followed by an isotropic etch.

2. The method according to claim 1, wherein said plasma comprises chlorine.

3. The method according to claim 2, wherein said plasma further comprises fluorine.

4. The method according to claim 3, wherein said electrostatic shield comprises a conductor.

5. The method according to claim 4, wherein said conductor comprises copper.

6. A process for minimizing residue from a reactor when etching layers in the reactor, said process comprising the following steps of:
    positioning a wafer in a source reactor, said wafer having features disposed thereon, said features being covered by a dielectric layer and a polysilicon layer, said covered feature having a retrograde profile, said source reactor comprising a bell jar, said bell jar comprising a dielectric, a shield is disposed over said bell jar;
    creating a plasma in said reactor; anisotropically etching said polysilicon layer; and
    isotropically etching any of said polysilicon layer obscured by said retrograde profile.

7. The process according to claim 6, wherein said plasma comprises chlorine.

8. The process according to claim 7, wherein said plasma comprises fluorine.

9. The process according to claim 8, wherein said bell jar comprises at least one of alumina and quartz.

10. The process according to claim 9, wherein said shield is an electrostatic shield.

11. The process according to claim 10, wherein said shield substantially prohibits capacitive coupling of said plasma with said reactor.

12. The process according to claim 11, wherein said ions further bombard said wafer, thereby etching said wafer.

13. A method for etching relatively closely spaced features, said method comprising the following steps of:
    disposing a substrate in a reactor, said substrate having closely spaced features disposed thereon, said features being covered by a dielectric, polysilicon being layered superjacent said dielectric, said features having a re-entrant profile;
    creating an atmosphere in said reactor, said atmosphere comprising halogen ions;
    substantially preventing capacitive coupling between said atmosphere and said reactor; and
    selectively removing portions of said polysilicon layer obscured by said re-entrant profile, said selective removal comprising an anisotropic etch followed by an isotropic etch.

14. The process according to claim 13, wherein said capacitive coupling is substantially prevented by a shield, said shield being conductive.

15. The process according to claim 14, wherein said reactor is a high density source reactor having a bell jar and magnets located outside said bell jar, said conductive shield being located outside said bell jar between said bell jar and said magnets.

16. The process according to claim 15, wherein said conductive shield is an electrostatic shield having at least one of a cylindrical and a hemispherical shape.

17. The process according to claim 16, wherein said conductive shield is comprised of copper, said conductive shield having voids in said cylinder, said voids being elongated.

18. The process according to claim 17, wherein said halogen ions comprise chlorine and fluorine.

* * * * *